United States Patent [19]

Beckett et al.

[11] Patent Number: 5,212,271
[45] Date of Patent: May 18, 1993

[54] PROCESS FOR OBTAINING TEXTURED COATINGS FROM PHOTO-CURABLE UREA-CONTAINING COMPOSITIONS

[75] Inventors: Alison D. Beckett, Nitro; Joseph V. Koleske, Charleston; Richard M. Gerkin, Cross Lanes, all of W. Va.

[73] Assignee: Texaco Chemical Company, Westchester, N.Y.

[21] Appl. No.: 455,100

[22] Filed: Dec. 22, 1989

[51] Int. Cl.$^5$ .......................... C08F 2/50; C08F 226/02
[52] U.S. Cl. ..................................... 526/301; 427/494; 522/8; 522/10; 522/14; 522/16; 522/18; 522/92; 522/96; 522/97; 522/103; 522/174; 526/302
[58] Field of Search ...................... 522/174, 42, 90, 96, 522/8, 10, 14, 16, 97; 526/301, 302; 427/494

[56] References Cited

U.S. PATENT DOCUMENTS

| | | | |
|---|---|---|---|
| 3,184,437 | 5/1965 | Hrubesch | 522/174 |
| 3,654,370 | 4/1972 | Yeakey | 564/480 |
| 3,661,744 | 5/1972 | Kehr | 522/97 |
| 4,320,221 | 3/1982 | Hoffman | 526/301 |
| 4,348,427 | 9/1982 | Priola | 522/96 |
| 4,421,784 | 12/1983 | Trove | 427/54.1 |
| 4,429,096 | 1/1984 | Schaefer | 526/302 |
| 4,483,884 | 11/1984 | Trove | 427/54.1 |
| 4,485,123 | 11/1984 | Trove | 427/54.1 |
| 4,512,340 | 4/1985 | Buck | 522/42 |
| 4,559,382 | 12/1985 | Martens | 522/97 |
| 4,716,209 | 12/1987 | Schmidt | 522/96 |
| 4,806,574 | 2/1989 | Krajewski | 522/96 |

FOREIGN PATENT DOCUMENTS 0243890  4/1987  European Pat. Off. .

Primary Examiner—Marion E. McCamish
Assistant Examiner—Arthur H. Koeckert
Attorney, Agent, or Firm—James L. Bailey; Jack H. Park; Kenneth R. Priem

[57] ABSTRACT

A process for texturing a coating via exposing a photocurable composition comprising a multifunctional urea compound, an ethylenically unsaturated compound, and an aromatic ketone photosensitizer that functions through a hydrogen abstraction mechanism when exposed to ultraviolet light.

22 Claims, No Drawings

PROCESS FOR OBTAINING TEXTURED COATINGS FROM PHOTO-CURABLE UREA-CONTAINING COMPOSITIONS

BACKGROUND TO THE INVENTION

1. Field of the Invention

This invention generally relates to a process for obtaining textured coatings from Photo-curable urea-containing compositions. More particularly the invention relates to photopolymerization of ethylenically unsaturated compounds using a combination of an aromatic ketone photosensitizer and a multifunctional urea compound.

2. Description of the Prior Art

It is known that photopolymerization processes have achieved considerable industrial importance particularly in situations where thin films or layers need to be cured in short times. Typical of such situations are the curing of clear coatings or overprint varnishes, colored coatings, inks, adhesives, printing plates, and the like. Such products are used in a variety of commercial end uses. Although the prime interest is for such thin-film technology, the importance of thick-film or thick-section radiation-cured technology is growing and increasing in importance. Thick-section technology is important in the area of sealants, adhesives, shaped parts, printing plates, fiber glass- or carbon/graphite fiber-reinforced products, and the like.

The use of aromatic ketones such as benzophenone, benzophenone derivatives, and the like as photosensitizers in the photopolymerization of ethylenically unsaturated compounds is also known in the art. However, some photosensitizers, such as benzophenone, will not function when used alone and require the presence of a second compound, a synergist. In addition, markedly faster polymerization rates can be obtained by the use of combinations of such aromatic ketones with synergists than is the case when such photosensitizers are used alone. The synergists usually are low molecular weight tertiary amines, ureas, or amides.

Combinations of photosensitizers and synergists that are commonly used include mixtures of one or more aromatic ketones, one of which is benzophenone, isopropylthioxanthone, or the like and a low molecular weight tertiary amine such as dimethylethanol amine, triethylamine, bis-(4,4'-dimethylamino)benzophenone (Michler's ketone), or the like. The combination of photosensitizer and a synergist is termed a photoinitiator system or a photoinitiator combination. Such combinations are said to function through an intermolecular hydrogen abstraction mechanism in which ultraviolet light is absorbed by the aromatic ketone which interacts with an amine or other suitable low molecular weight nitrogen-containing compound that has an alpha-hydrogen and rapidly forms an excited complex. This complex, or "exiplex" as it is often termed, undergoes rearrangement with the transfer of a hydrogen atom from the amine causing the amine to become the free radical initiator molecule that causes rapid polymerization of acrylates and other appropriate ethylenically unsaturated compounds. If used alone, the amine or other nitrogen-containing compound will not effect polymerization. Although this mechanism is felt to be true, this invention is not limited by it or any other described mechanism.

The textured finish is a visual or tactile surface or appearance of something that is characterized by a woven or interwoven appearance which in turn is characterized by the number of weaves or strands per unit of surface. The nature of the textured finish may be very coarse, very fine, or variations between these limits. Also, the textured finish may have excellent optical clarity, translucency, or opacity. In a general sense, it means a rough-appearing surface rather than a smooth appearing surface. Textured coatings are both useful and decorative. They can provide a nonglare surface that can be used in various ways including coatings for business machines, control lights, light emitting diodes, and other end uses. In addition, textured coatings tend to hide surface dirt or soil as well as slight surface imperfections.

It is also known that various finishes for substrate coatings are desirable. These finishes include matte or flat, glossy, wrinklè or hammer-tone, or intermediate variations of such finishes. In the photo-curing industry, texturing is difficult to achieve and technology has been developed on special processes for preparing textured, ultraviolet light-cured coatings. In a general sense, this technology relates to control of the surface, the curing environment, and the light source type, intensity and number of exposures. The overall results are workable but complicated processes.

According to U.S. Pat. No. 4,421,784 textured finishes have been achieved in a variety of ways including by using particular formulations or additives such as flatting agents, allowing a time interval between exposures to ultraviolet light, curing all of the coating except the surface and then subjecting the uncured surface to ultraviolet light in air until the surface is fully cured, using ultraviolet light to obtain first a partial cure of the exterior and the interior in air and completing the cure, and curing in air all of the coating except the surface and then irradiating the surface in an inert atmosphere, and curing first the interior of the coating.

U.S. Pat. No. 4,421,784 is an improvement over the known processes and involves applying an ultraviolet light curable formulation with a viscosity of at least 50 centipoise to a substrate and increasing the coating viscosity by exposing the coated substrate to ultraviolet light with a wavelength of 180 to 275 nm in an inert atmosphere for a period of time sufficient to initiate texturing on the coating surface. After exposure, the coated substrate is maintained in a space devoid of ultraviolet light for a period of time sufficient for the surface to texture. The surface-textured coating is then exposed to ultraviolet light with a wavelength of about 180 to 400 nm in an inert or an air atmosphere until the coating is cured.

U.S. Pat. No. 4,483, 884 is an improvement over U.S. Pat. No. 4,421,784 cited above in that it provides for dark colored and light colored, nonreflective and reflective to ultraviolet light backgrounds to be used during the curing process.

U.S. Pat. No. 4,485,123 is yet another improvement over U.S. Pat. No. 4,421,784 cited above in that it provides for dark colored and light colored infrared adsorbent and reflective backgrounds to be used during the curing process.

The currently known methods for texturing radiation curable coatings have many deficiencies. They require the use of specially designed coating equipment with a prechamber for initiation of cure that contains an ultraviolet light source of a special low wavelength, a dark area or tunnel in which essentially no ultraviolet light is present, and a third area in which the coating is subjected to full spectrum ultraviolet light to complete the cure. In addition, it is necessary for an inert environment to be used in the prechamber. Improvements in this process require the use of special dark or light colored ultraviolet light or infrared reflective or nonreflective background surfaces or substrates to be used during the texturing process.

OBJECTIVES OF THE INVENTION

An object of the present invention is to provide coating and ink compositions that will texture when exposed to ultraviolet light of broad spectrum, such as that obtained from a medium pressure mercury vapor lamp, without involving special, sequenced ultraviolet lamps in a complicated processes.

Another object of the present invention is to provide coating compositions that do not require the use of an inert atmosphere or special ultraviolet light or infrared backgrounds during the texturing process or ultraviolet light exposure.

Another object of the present invention is to significantly decrease the amount of ethylenically unsaturated acrylate used in a given formulation, which acrylates are known to be skin and eye irritants and which can have other undesirable health characteristics.

Still another object of the present invention is to provide less system polymerization shrinkage and thus improved inherent adhesion in the final cured film or product.

SUMMARY OF THE INVENTION

This invention provides for a process for producing textured coatings or inks through the use of multifunctional urea compounds as aromatic ketone photosensitizer synergists or cophotosensitizers in photo-curable, ethylenically-unsaturated formulations. It has now been found that these materials give excellent textured surfaces via a simple process without exhibiting the disadvantages described above.

Although it is preferred that the urea compounds of this invention be used with aromatic ketone photosensitizers such as benzophenone, chlorothioxanthone, and the like, that function through an intermolecular hydrogen abstraction mechanism, other photoinitiators can be used. In addition, the aromatic ketone photosensitizers can be used alone, in combination with each other, or in combination with photoinitiators that function via a homolytic fragmentation mechanism when used in combination with the urea compounds and photopolymerizable ethylenically unsaturated compounds. The composition can contain various amounts of the urea compounds wherein said amounts will depend on the molecular weight/equivalent weight of said urea compound and on the desired performance characteristics of the textured product including degree of texturing.

DETAILED DESCRIPTION OF THE INVENTION

In accordance with the present invention there is provided a process for producing textured coatings that employ ureas of the general formula:

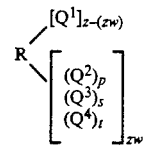

wherein R is an initiator radical based on a compound containing Zerewitinoff active hydrogen atoms and is capable of initiating polymerization with alkylene oxides when used with a suitable catalyst such as potassium hydroxide, zinc hexacyanocobaltate, and the like. It is understood by those skilled in the art that not all of the potential active hydrogen atoms must become activated during the reaction process of making polyols and some of the starting functionality such as hydroxyl may remain on the initiator molecule.

Examples of such compounds that contain Zerewitinoff active hydrogen atoms include but are not limited to difunctional compounds such as ethylene glycol, propylene glycol, water, 1,4-butanediol, diethylene glycol; trifunctional compounds such as trimethylolpropane, glycerol, trimethylolethane; and other higher functional compounds such as pentaerythritol, sorbitol, sucrose, ammonia, ethylene diamine, 1,3-diaminopropane, 1,6-hexanediamine, isomers of phenylenediamine and toluenediamine, 4,4'-diphenylmethane diamine and its isomers, diethanolamine, ethanolamine, dimethylethanolamine, N-methylethanolamine, triethanolamine, triisopropanolamine, and propylene disulfide.

Additional examples of compounds suitable for initiating polymerization of alkylene oxides are the various oligomeric polyols known in the art. These include the poly(1,4-butylene oxide) polyethers and the hydroxyl- and amine-terminated polybutadienes. When polyols (or other oligomers) are used for initiating polymerization of the alkylene oxides, their molecular weights can range from 400 to 3000 (oligomeric to polymeric). When the conventional initiators such as described above (i.e., glycerine, water, etc.) are used, their molecular weight can range from about 18 up to about 400. Preferably R contains from two to about six carbon atoms.

Examples of R include but are not limited to initiator radicals such as the following:

(1) if R is linear and has three carbon atoms as it would have from glycerol, it would have the structure

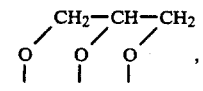

(2) if R is branched and has six carbon atoms as it would have from trimethyolpropane, it would have the structure

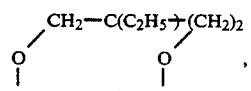

and (3) if R is branched and has 5 carbon atoms as it would have from pentaerythritol and if only three of the active hydrogens had been removed, it would have the following structure

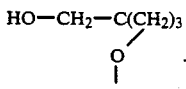

(4) if R is linear and difunctional and is derived from a (tetramethylene oxide)polyol or poly (1,4 butylene oxide) as it would have from the initiation and polymerization of tetrahydrofuran with water, it would have the structure

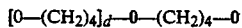

wherein d can range from zero to fifty with the preferred range four to 35. Hydroxyl terminated poly (tetramethylene oxide) products obtained by the polymerization of tetrahydrofuran, are commercially available as Polymeg TM and Terethane TM manufactured by Quaker Chemical Company and Dupont Company wherein the initiator is unknown.

The alkylene oxides and other monomers that find utility in the present invention are those well known in the art. These include ethylene oxide, propylene oxide, the alpha-olefin oxides such as 1,2-epoxybutane, and 1,2-epoxyoctadecane, oxetane, and tetrahydrofuran.

"Q''''" represents a hydroxy-containing group of the formula

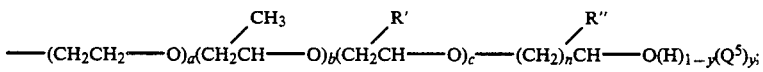

"Q" represents a primary amine-containing group of the formula

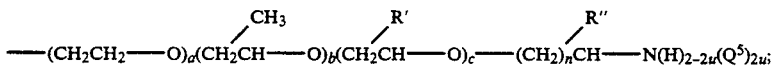

"Q" represents a secondary amine-containing group of the formula

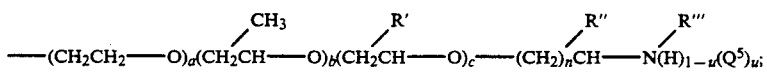

and "Q" represents a tertiary aminecontaining group of the formula

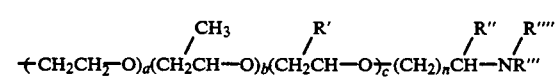

wherein:
(1) the letter "a" defines the ethylene oxide content of the urea and can range from a value of zero to 175 with the preferred range being from zero to 90, and, when "b" or "c" is not equal to zero, the most preferred range is from zero to 50,
(2) the letter "b" defines the propylene oxide content of the urea and can also range from a value of zero to 175 with the preferred range being from zero to 115, and the most preferred range from three to 98,
(3) the letter "c" defines the alpha-olefin oxide ($CH_2CH(R')$) 0 content of the urea and can range from zero to 30 with the preferred range being from zero to 15 and the most preferred range from zero to 2,
(4) the letter "n" equals an integer equal to from 1 to 3 and preferably 1 or 3,
(5) the letter "y" is 0 to u, and
(6) the letter "u" is relative urea content and can range from 0.3 to 1.0 and most preferably 0.4 to 1.0.

Ethylene oxide, propylene oxide, alpha-olefin oxide, and tetramethylene oxide, can be incorporated into the product backbone in any sequential manner, i.e., random or block sequence, in any configuration or conformation.

R' is an alkyl group containing from two carbon atoms to 18 carbon atoms depending on the alpha-olefin oxide used in preparation of the urea. While R' can contain up to 18 carbon atoms, it is most preferred that R' contain two carbon atoms.

R'' is hydrogen or an alkyl group containing from one up to 18 carbon atoms with it preferred that R'' is hydrogen or an alkyl group with up to two carbon atoms and with it most preferred that R'' is hydrogen or a methyl group.

R''' and R'''' are independently an alkyl group containing from two to 12 carbon atoms and preferably containing from two to six carbon atoms.

The group "Q", which can be the same or different throughout depending on the isocyanate, represents

wherein $R^5$ is hydrogen, alkyl of one to 10 carbon atoms, aryl, substituted aryl, allyl, aralkyl, cycloalkyl, phenyl, substituted phenyl.

p is a mole fraction of the primary aminated portion of the amine reactant and is from 0 to 1.0, preferably from 0 to less than 0.75;

s is a mole fraction of the secondary aminated portion of the amine reactant and is from 0 to 1.0, preferably from 0.25 to 1.0;

t is a mole fraction of the tertiary aminated portion of the amine reactant and is from 0 to 0.75, preferably from 0 to 0.5;

w is the percent amination of the Zerwitinoff active hydrogen atoms on the intermediate compound, generally 30 percent to 100 percent, and preferably 70 percent or more; and (zw) is the product of z and w;
The sum of p, s, and t must equal 1.0.
The letter "z" is an integer equal to the number of Zerewitinoff active hydrogens on the initiator and must be at least two. The letter "z" is preferably 2 to 6.

The above parameters describe amines with equivalent weights ranging from about 100 to 10,000 or more when the functionality is between 2 and 6 but it is preferred that equivalent weights of from 600 to 10,000 or more be used in the practice of this invention.

The ureas that are useful in the present invention are prepared by direct, catalytic amination of an appropriate polyol such as

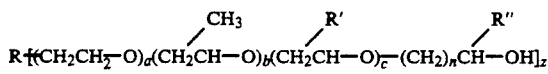

with an amine such as R''' —NH$_2$ or R'''—N(H)—R''''. Details of the procedure for preparation of the compounds can be found in copending U.S. Pat. Application Ser. No. 176,222 filed on Mar. 31, 1988 and U.S. Pat. No. 3,654,370. This amine terminated polyether is then reacted with a bifunctional isocyanate to obtain the useful ureas. Illustrative of the bifunctional isocyanates that can be used to prepare the ureas from the aminated polyol are m-isopropenyl-alpha,alpha- dimethylbenzyl isocyanate, isocyanatoethyl methacrylate; p-isopropenyl-alpha,alpha- dimethylbenzyl isocyanate; 2-isocyanato ethyl acrylate; 3-isocyanatopropyl triethoxysilane; napthalene isocyanate and the like.

The aromatic ketone photosensitizers are those aromatic ketones which act as photosensitizers and in which a ketonic group is attached directly to a carbon present in an aromatic or unsaturated ring. Illustrative of such compounds are benzophenone and benzophenone derivatives, xanthen-9-one, thioxanthone, 2-chlorothioxanthone, isopropylthioxanthones, 2,3-diethylthioxanthone, Sodium-4-(Sulphomethyl)benzil, (4-benzoylbenzyl)trimethylammonium chloride, sodium-4'-(sulphomethyl)benzophenone, fluorenone, benzil, bis-(4,4'-dimethylamino)benzophenone, 4-chlorobenzophenone, 4-phenylbenzophenone, 4-p-tolylthiobenzophenone, 2-methylanthraquinone, dibenzosuberone, biacetyl, dodecylthioxanthenones, 9,10-anthraquinone, camphor quinones, 1,3,5-triacetylbenzene, 3-ketocoumarines, acridone, p-diacetylbenzene, 3-acetylphenanthrene, penanthrenquinone, and the like. Preferably, benzophenone or benzophenone derivatives.

Illustrative of the ethylenically unsaturated monomers suitable for use in the invention are the esters of acrylic and methacrylic acid with monohydric and polyhydric compounds, such as methyl, ethyl, propyl, butyl, pentyl, hexyl, octyl, decyl, and the like acrylates and methacrylates as well as the various isomers of these and other listed compounds, neopentyl glycol diacrylate, esterdiol diacrylates such as 2,2-dimethyl-3-hydroxypropyl-2,2-dimethyl-3-hydroxypropionate diacrylate, trimethylolpropane triacrylate, pentaerythriol di-, tri-, and tetraacrylate, hyroxyethyl acrylate, hydroxypropyl acrylate, caprolactone acrylates, ethoxylated acrylates, propyoxylated acrylates, glycerol acrylates, triethylene glycol diacrylate, tetraethylene glycol diacrylate, ethoxyethyl acrylate, cyclohexyl acrylate, 2-phenoxyethyl acrylate, isobornyl acrylate, 1,3-butylene glycol diacrylate, 1,4-butanediol diacrylate, 1,6-hexanediol diacrylate, glycidyl acrylate, as well as the methacrylates of such compounds, and the like; styrene, divinylbenzene; N-vinylpyrrolidone, and the like. Illustrative of the oligomers or polymers which can be used in the photopolymerizable reaction formulations are poly(ethylene glycol) acrylates, caprolactone di-, tri-, and tetraacrylates, tripropylene glycol diacrylate, poly(propylene glycol) acrylates, ethoxylated or propoxylated Bisphenol A diacrylates, alkoxylated esterdiol diacrylates such as ethoxylated or propoxylated 2,2-dimethyl-3-hydroxypropyl-2,2-dimethyl-3-hydroxypropionate diacrylates, acrylates of caprolactone reacted with esterdiols, ethoxylated or propoxylated trimethylolpropane triacrylate, ethoxylated or propoxylated pentaerythriol di-, tri, or tetracrylate, unsaturated polyesters containing ethylenic unsaturation from maleic, fumaric, citraconic, and the like unsaturated dicarboxylic acids, urethane acrylates of various types, epoxy acrylates, acrylated polybutadiene, acrylated linseed oil, acrylated soyabean oil, and the like. Compounds such as those mentioned are known to those skilled in the art and many are commercially available. Preferably the acrylates are employed, such as monoacrylates, diacrylates, triacrylates and acrylates of higher functionality.

The photopolymerization process of this invention is conducted in accordance with procedures conventional in the art with the distinguishing feature being the use as the photoinitiator of a combination of an aromatic ketone photosensitizer and an urea compound. The formulations or systems of this invention which are used in the photopolymerization processes comprise one or more photopolymerizable, ethylenically unsaturated monomers, oligomers, and polymers, one or more urea compounds of the present invention, and one or more photosensitizer or mixture of photosensitizer and photoinitiator. The formulations may also contain a variety of additives including stabilizers such as hydroquinone or methyoxyhydroquinone which prevent premature polymerization during preparation, handling, and storage of the system, antioxidants, surfactants or other flow and leveling agents, fillers, pigments, silane or titanium coupling agents, thickeners, inert solvents, inert polymers, waxes, adhesion promoters, slip agents such as the silicone oils, powdered polytetrafluoroethylene and/or polyethylene, and the like which are known to those skilled in the art of coating formulation some of which are discussed in more detail below The formulations are applied to appropriate substrates as thin films by a variety of processes illustrative of which are roll coating, dip coating, spray coating, brushing, flexographic, lithographic, and offset web printing processes, and the like.

The photopolymerization is carried out by exposing the film or coating to light radiation which is rich in short-wave radiation. Particularly useful is radiation of about 200 to about 450 nanometers in wavelength. Illustrative of appropriate light sources are low pressure, medium pressure, and high pressure mercury vapor lamps, xenon and other flash-type lamps, fluorescent lights, lasers, electrodeless mercury lamps, and the like. Other sources of radiant energy such as electron beams, gamma radiation, X-rays, sunlight, and so on can also be used.

Usually proper selection of the above formulation ingredients will yield systems that are easily applied. However, in certain cases it may be desirable to reduce the viscosity by adding one or more inert or nonreactive solvents to the systems in amounts of about one to about 25 weight percent for the purpose of improving flow characteristics or for altering other response characteristics. In certain cases, it may be desirable to use more than 25% of the solvent. Illustrative of such solvents are 1,1,1-trichloroethane, butanol, ethanol, ethoxyethanol, ethoxyethyl acetate, ethoxybutanol, ethoxybutanol acetate, butyl acetate, methyl isobutyl ketone, methyl ethyl ketone, methyl amyl ketone, propylene glycol methyl, propyl, and butyl ethers, dipropylene glycol alkyl ethers, and the like. In certain instances it may be desirable to add water or a mixture of water and organic solvent to the coating formulation.

It may also be desirable to thicken certain formulations such as those used for screen printing or other end use requiring special rheological responses. Illustrative of the various inert thickening agents that may be employed are fumed silicas, clays, glass spheres or other microballoons, aluminum trihydrate, polymers such as cellulose acetate butyrate, vinyl polymers, phenoxy, acrylates, and the like. The amount of such materials used in a system is dependent on the desired viscosity, thixotropy, or other flow characteristic and is known by those skilled in the art of formulating coatings, inks, and the like.

Although the components of the formulations are miscible, it may be necessary for times as long as 24 hours or more to elapse under ambient conditions to ensure that a photosensitizer such as benzophenone is well dissolved in the system and that optimum results are obtained. As is known to those skilled in the art of coating formulation such a time is dependent on many factors including formulation components, photosensitizer concentration, temperature, and the like. In special cases, it may be necessary to agitate the system during use to ensure miscibility of all components.

When carrying out the photopolymerizable process or method of the invention, the various components of the system can be brought together in any order using any conventional type of mechanical or manual blending equipment. The aromatic ketone photosensitizer or mixture of aromatic ketone photosensitizers, the urea compound or mixtures of more than one of the urea compounds if desired, and if desired the optional type photoinitiators can be added as separate components to the formulation or they can be preblended and added as a single component. If desired, the mixtures may also contain minor amounts of less than 1 percent to about 2 percent of known synergists such as diethanolamine, triethylamine, or the like. The latter preblending method is sometimes preferred since in many instances all the components of the system other than the photoinitiator composition may be prepared and stored prior to use and the photoinitiator composition is only added immediately before use. In addition, certain aromatic ketone compounds such as benzophenone are solids and require the passage of time to effect dissolution. Preblending will yield a liquid, easily handled and used mixture that is immediately ready for use. This method avoids any possible instability or reactivity problems which might arise if all the components of the system were mixed and then stored for extended periods before use. As known to those skilled in the art of formulating photocurable acrylate systems, the length of shelf storage is variable and depends on such factors as temperature, presence of light and particularly ultraviolet light, air space in container, and the like.

The amount in which the mixture of components is used in the photopolymerizable systems of the invention can vary over a wide range depending on the nature of the system. Generally, from about 2 to about 65 weight percent of the combination aromatic ketone photosensitizer and multifunctional urea compound is used based on the total weight of the photocurable materials. Preferably, 2 to 50 weight percent. The proportion in which the aromatic ketone photosensitizer is blended with the urea compounds of the invention is broad and depends on the molecular weight/equivalent weight of the compounds. In general the aromatic ketone photosensitizer is present in an amount ranging from about 0.5 to about 15 weight percent based on the total photocurable materials. More preferably from about 1 to about 10 weight percent is used. The photoinitiator composition can optionally contain up to about 75 weight percent of a homolytic fragmentation type photoinitiator based on the weight of the mixture of the aromatic ketone photosensitizer, multifunctional urea compound and homolytic photoinitiator.

Illustrative of the homolytic fragmentation type photoinitiators are the benzil ketals, 2,4,6-trimethylbenzoyl-diphenylphosphine oxide, acetophenone and derivatives such as 2,2-diethoxyacetophenone, 2,2-dimethoxy-2-phenylacetophenone, 2-hydroxy-2,2-dimethylacetophenone, and the like, 1-benzoyl-cyclohexane-1-ol, benzoin, alkyl benzoin ethers such as methyl, ethyl, isopropyl, n-butyl, isobutyl benzoin ethers, and the like.

The compositions of the invention can be exposed to radiation in a variety of atmospheres illustrative of which are air, nitrogen, argon and the like. It has been found that the coatings do not require an inert atmosphere for cure and either an active or oxygen-containing atmosphere such as air or an inert atmosphere such as nitrogen can be used.

In addition to providing solid, functional and decorative textured surfaces, the compositions of this invention give excellent results in terms of adhesion to a variety of substrates, of rapidity with which cure of the photopolymerizable systems can be effected, in terms of textured surface finish, of absence of yellowing, of excellence of mechanical properties when applied in film form as well as low odor systems. Illustrative of such substrates are steel, treated steel, tin plated steel, galvanized steel, treated and untreated aluminum, glass, wood, paper, coated or printed paper, epoxy fiberglass composites, flame retarded epoxy fiberglass composites such as those used in the manufacture of printed circuit boards, graphite fiber reinforced laminates/composites, polymers such as poly(ethylene terephthalate), poly(butylene terephthalate), treated polyethylene and polypropylene, vinyl film, vacuum or vapor deposited aluminum, gold, and other metals, glass reinforced unsaturated polyester/styrene products, and the like.

The composites of this invention are useful in a variety of end uses. Illustrative of these end uses are general metal coatings for steel, tin plated steel, tin-free steel, galvanized steel, phosphatized or other treated steel, aluminum, copper, tin-lead solders, as well as other metals, glass, wood, appliance coatings, business machine coatings, office equipment coatings, lamp and lighting fixture coatings, beverage and other can coatings, decorative coatings, functional non-glare coatings, overprint varnishes, inks, sealants, adhesives, coatings for electronics such as laser markable coatings, conformal coatings, photoresists, solder masks or resists, coatings for optical fibers, coatings for glass fiber-reinforced polyester materials, coatings for sputtered or vapor deposited aluminum, gold or other metals, graphite or carbon fiber reinforced laminates/composites, coatings for glass, wood, plastics such as polyesters, polycarbonate, polysulfone, treated polyethylene and polypropylene, and the like.

Whereas the exact scope of the instant invention is set forth in the appended claims, the following specific examples illustrate certain aspects of the present invention and, more particularly, point out methods of evaluating the same. However, the examples are set forth for illustration only and are not to be construed as limitations on the present invention except as set forth in the appended claims. All parts and percentages are by weight unless otherwise specified.

The coating compositions prepared in the examples below were evaluated according to the following procedures.

Solvent Resistance (Double Acetone Rubs):

A measure of the resistance of the cured film to attack by acetone in which a film coating surface was rubbed with an acetone-soaked cloth back and forth with hand pressure. A rub back and forth over the film coating surface with the acetone soaked cheesecloth was designated as one "double acetone rub." The effect that a certain number of double acetone rubs had on the film coating surface was reported by a number in parenthesis following the number of double acetone rubs. The rating system for evaluating acetone resistance for a given number of double acetone rubs was as follows:

Number in Parenthesis After Number of Rubs (1) No change in coating appearance
(2) Surface scratched
(3) Surface dulled or marred. some coating removed
(4) Breaks in coating apparent
(5) About 50% or more of coating removed Pencil Hardness: Pencil leads of increasing hardness values were forced against the film coating surface in a precisely defined manner as described in ASTM D3363-74 until one pencil lead cut through the surface of the film coating. The surface hardness was considered as the hardest pencil grade which just failed to cut or mar the film coating surface. The pencil leads in order of softest to hardest were reported as follows: 6B, 5B, 4B, 3B, 2B, B, HB, F, H, 2H, 3H, 4H, 5H, 6H, 7H, 8H, AND 9H.

Crosshatch Adhesion: A lattice pattern with ten cuts in each direction was made in the coating film to the substrate and pressure-sensitive adhesive tape (Scotch Brand 606) was applied over the scored/cut substrate and then quickly removed as prescribed in ASTM D3359-78. The adhesion was evaluated by comparison with descriptions and illustrations as more fully detailed in the cited method.

Gardner Impact Resistance: A measure of the ability of a cured film coating on a substrate to resist rupture from a falling weight. A Model IG-1120 Gardner Impact Tester equipped with an eight-pound dart was used to test film coatings cast and cured on steel panels. The dart was raised to a given height in inches and dropped onto either the coated side of the coated steel panel (direct or forward impact resistance) or the uncoated side of the coated steel panel (reverse impact resistance). The height-of-drop in inches times weight of dart (8 pounds), designated as inch-pounds, absorbed by the film without rupturing was recorded as the films direct or reverse impact resistance.

Gloss: Gloss measurements were made at either 20 degrees and/or 60 degrees in accordance with ASTM D523-78 using a Gardner gloss meter equipped with 20 and 60 degree heads.

GLOSSARY

Polyamine I is a triamine-functional, propylene oxide compound with an equivalent weight of about 2169 and an amine number of about 0.461 meq/g. It contains about 73% primary amine end groups, about 20–25% secondary amine end groups, and 0 to 5% tertiary amine end groups. If all end groups in a given molecule were primary, it would have the following average structure.

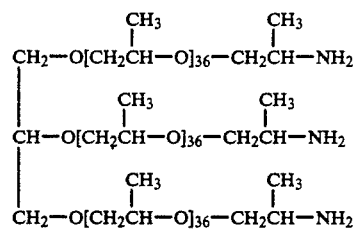

Isocyanate I is m-isopropenyl-alpha,alpha-dimethylbenzyl isocyanate with a molecular weight of 201, a theoretical isocyanate content of 20.9%, and a boiling point of 270° C. It is marketed by American Cyanamide Company under the tradename TMI.

Surfactant I is a silicone/alkylene oxide surfactant marketed by Union Carbide Corporation under the designation SILWET TM L-7604.

Surfactant II is a fluorochemical surfactant marketed by 3M Company under the designation FLUORAD FC-430.

Surfactant III is a silicone/alkylene oxide surfactant marketed by Union Carbide Corporation under the designation SILWET TM L-7610.

Surfactant IV is a silicone/alkylene oxide surfactant marketed by Union Carbide Corporation under the designation L-5420.

Epoxy Diacrylate I is an acrylated epoxide marketed by SARTOMER as Epoxy Diacrylate C-3000. It has a viscosity of about one million centipoise at 25° C.

EXAMPLES

1. This example describes the preparation of an urea derivative from a polyamine and a bifunctional compound. Because only partial capping of the amine function was carried out, the final product contained both some of the original, unreacted amine end groups and urea-containing end groups with the following structure when one active hydrogen of a primary amine groups had reacted with an isocyanate molecule.

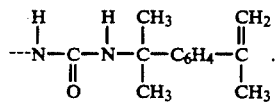

Those skilled in the art will understand that some reaction will also take place with the secondary amine groups on the molecules Polyamine I, 450 grams (0.207 equivalents), was added to a one-liter, glass reaction flask equipped with a thermo-watch, stirrer and nitrogen inlet and outlet and heated to 70° C. under a nitrogen atmosphere. Then, 20.9 g (0.104 eq.) of Isocyanate I were rapidly added while stirring. The reaction mixture exothermed to about 80° C. After the exotherm, the system cooled to the reaction temperature of 70° C which was maintained for 3.5 hours. After this time, an infrared spectrum indicated no isocyanate functionality remained in the product which was then cooled to room temperature and stored for later use. The isolated, partially capped polyamine/urea compound had a viscosity of 3,985 centistokes at 25° C., an amine number of 0.209 meq/g, and an unsaturation content of 0.224 meq/g.

2. This example describes the preparation of an urea derivative from a polyamine and a bifunctional compound and differs from Example 1 in that all amine functionality was reacted with bifunctional compound to produce an essentially fully capped product. Example 1 was repeated except in this instance 0.207 equivalents of Isocyanate I were added. After three hours at 70° C., infrared analysis indicated all the isocyanate functionality had reacted and the product was cooled to room temperature and stored for later use. The isolated, fully capped polyurea compound had a viscosity of 8,975 centistokes at 25° C., an amine number of 0.011 meq/g, and an unsaturation content of 0386 meq/g.

Examples 3 through 6. The following ingredients were placed in a glass container and well mixed.

| | Example | | | |
|---|---|---|---|---|
| Ingredients, grams | 3 | 4 | 5 | 6 |
| Polyamine/urea Compound of Example 1 | 4.9 | 4.9 | 5.0 | 5.0 |
| Trimethylol propane triacrylate | 5.0 | 5.0 | 5.0 | 5.0 |
| Benzophenone | 0.1 | 0.3 | 0.3 | 0.3 |
| Surfactant I | 0.05 | 0.05 | 0.10 | — |
| Surfactant II | — | — | — | 0.05 |

The formulations were coated onto Bonderite 37 Steel panels with a number 15 wire-wound rod and then exposed to a 100 watt/inch medium pressure mercury vapor lamp for three minutes in an air atmosphere. Exposure was equivalent to radiant energy of 3.7 joules/cm$^2$. The resulting coatings had uniform textured surfaces and the following properties. No quantitative measure of the degree of texturing was made.

| Property | 3 | 4 | 5 | 6 |
|---|---|---|---|---|
| Acetone Double Rubs | 100 (1) | 100 (1) | 100 (1) | 100 (1) |
| Pencil Hardness | F | F | F | F |
| Crosshatch Adhesion | 5B | 5B | 5B | 5B |

Examples 7 and 8. Example 7 is a Control Example that demonstrates that the polyamine used to prepare the partially or fully capped urea does not Yield a texture surface. Example 8 demonstrates that fully capped polyamine compounds will yield textured surfaces.

| | Example | |
|---|---|---|
| Ingredients, grams | 7 (Control) | 8 |
| Polyamine I | 5.0 | — |
| Polyamine/urea Compound of Example 2 | — | 5.0 |
| Trimethylol propane triacrylate | 5.0 | 5.0 |
| Benzophenone | 0.3 | 0.3 |
| Surfactant I | 0.1 | 0.1 |

The formulations were coated onto Bonderite 37 steel panels and cured in the same manner as described for Examples 3-6. The control example coating had a smooth, high gloss surface. The coating of Example 8 had a very fine textured surface and a matte appearance. The coatings had the following properties.

| Property | 7 (Control) | 8 |
|---|---|---|
| Acetone Double Rubs | 100 (1) | 100 (1) |
| Pencil Hardness | F | F |
| Crosshatch Adhesion | 5B | 5B |

Examples 9 through 13. These examples exemplify that various surfactants and different surfactant concentrations can be used in the formulations and textured films can be obtained. In addition, different concentrations of benzophenone (photosensitizer) can be used to obtain textured films. The following ingredients were placed in a glass container and well mixed.

| | Example | | | | |
|---|---|---|---|---|---|
| Ingredients, grams | 9 | 10 | 11 | 12 | 13 |
| Polyamine/urea Compound of Example 1 | 5.0 | 5.0 | 5.0 | 5.0 | 5.0 |
| Trimethylol propane triacrylate | 5.0 | 5.0 | 5.0 | 5.0 | 5.0 |
| Benzophenone | 0.3 | 0.3 | 0.3 | 0.6 | 0.3 |
| Surfactant III | 0.1 | — | — | — | — |
| Surfactant IV | — | 0.05 | 0.1 | 0.1 | 0.2 |

The formulations were coated onto Bonderite 37 steel panels and cured in the same manner as described for Examples 3-6. except that a six minute exposure was used. The resulting coatings had uniform textured surfaces. A control example from a formulation identical to Example 7 was also cured under the same conditions. It yielded a smooth, glossy, high "definition-of-image" finish.

Examples 14 through 16. These examples demonstrate that blends of a polyamine and a polyamine that has been capped with a bifunctional isocyanate compound will yield textured finishes. The blends contain various amounts of the capped polyurea. The following ingredients were placed in a glass container and well mixed.

| | Example | | |
|---|---|---|---|
| Ingredients, grams | 14 | 15 | 16 |
| Polyurea Compound of Example 2 | 3.75 | 2.50 | 1.25 |
| Polyamine I | 1.25 | 2.50 | 3.75 |
| Trimethylol propane triacrylate | 5.0 | 5.0 | 5.0 |
| Benzophenone | 0.3 | 0.3 | 0.3 |
| Surfactant IV | 0.1 | 0.1 | 0.1 |

The formulations were coated onto Bonderite 37 steel panels and cured in the same manner as described for Examples 9-13. The resulting coatings had uniform textured surfaces. A control example from a formulation identical to Example 7 was also cured under the same conditions. It yielded a smooth, glossy, high "definition-of-image" finish.

Examples 17 and 18. This example describes the preparation of an urea derivative from a polyamine and a bifunctional compound and differs from Example 1 in that different amounts of amine functionality were reacted with bifunctional isocyanate compound to produce partially capped product. Example 1 was repeated except that in this instance the indicated amounts and equivalents Isocyanate I were added. After one hour 70° C., infrared analysis indicated all the isocyanate functionality had reacted and the product was cooled to room temperature and stored for later use without further analysis.

|  | Example | |
| Ingredients | 17 | 18 |
| --- | --- | --- |
| Polyamine I, g | 200 | 200 |
| (Polyamine I, eq) | 0.0922 | 0.0922 |
| Isocyanate I, g | 4.63 | 13.9 |
| (Isocyanate I, eq) | 0.0231 | 0.0693 |
| Reaction time at 70° C. | 1 hr | 1 hr |
| Percent of amine functionality reacted | 25% | 75% |

Examples 19 and 20. These examples demonstrate that polyamines that have been partially capped with a bifunctional isocyanate compound will yield textured finishes when used in combinations with acrylates. The following ingredients were placed in a glass container and well mixed.

|  | Example | |
| Ingredients, grams | 19 | 20 |
| --- | --- | --- |
| Polyamine/urea Compound of Example 17 | 5.0 | — |
| Polyamine/urea Compound of Example 18 | — | 5.0 |
| Trimethylol propane triacrylate | 5.0 | 5.0 |
| Benzophenone | 0.3 | 0.3 |
| Surfactant IV | 0.1 | 0.1 |

The formulations were coated onto Bonderite 37 steel panels and cured in the same manner as described for Examples 9–13. Both coatings had a texturized surface. The coatings had the following properties.

| Property | 19 | 20 |
| --- | --- | --- |
| Acetone Double Rubs | 100 (1) | 100 (1) |
| Pencil Hardness | F | F |
| Crosshatch Adhesion | 4B | 4B |

Examples 21. This example demonstrates that films of different thickness will texture when the urea compounds are used. Five grams of Example 1 Polyamine/urea in which about 50% of the amine functionality was reacted with Isocyanate I, five grams of trimethylolpropane triacrylate, 0.3 gram of benzophenone, and 0.1 gram of Surfactant IV were place in a glass vessel and well mixed. The mixture was then coated onto Bonderite 37 steel panels with different numbered wire-wound rods to produce coatings of varying thickness. As indicated below, all coatings had a textured finish when exposed for 6 minutes to a 100 watt per inch ultraviolet light source in an air atmosphere.

| Wire-wound Rod No. | Coating Thickness, mil | Type Surface |
| --- | --- | --- |
| 22 | 1.3 | Textured |
| 40 | 2.5 | Textured |
| 80 | 3.75 | Textured |

Example 22. The coating formulation of Example 21 was coated onto a Bonderite 37 steel panel with a number 22 wire wound rod and cured as described in Example 21. After cure, the coated panel was recoated with a second layer of the same formulation and then cured again in the same manner. A uniform texture finish resulted. Coating thickness was about 3.5 mils.

Example 23–28. The following ingredients were placed in glass bottles, well mixed and stored for later use. In addition to demonstrating systems that will texture when exposed to ultraviolet light, they demonstrate that large amounts of benzophenone can be used in the compositions, that other acrylates such as epoxy acrylates can be used, and that the compositions can be cured with different light sources in different atmospheres (air or nitrogen, and at different cure speeds (conveyor speeds).

|  | Example | | | | | |
| Ingredients, g | 23 | 24 | 25 | 26 | 27 | 28 |
| --- | --- | --- | --- | --- | --- | --- |
| Polyurea Compound of Example 2 | 50.0 | 50.0 | 50.0 | 40.0 | 40.0 | 40.0 |
| Trimethylolpropane triacrylate | 50.0 | 50.0 | 50.0 | 40.0 | 40.0 | 40.0 |
| Epoxy Diacrylate I | — | — | — | 20.0 | 20.0 | 20.0 |
| Benzophenone | 8.0 | 8.0 | 8.0 | 3.0 | 3.0 | 3.0 |
| Surfactant I | — | — | — | 0.5 | 0.5 | 0.5 |

These formulations were cured with the following ultraviolet light sources under the conditions indicated and on the indicated substrates. In all cases, textured surfaces were obtained.

Cure Unit I is a commercial PS-7001 ultraviolet light photocure system that is marketed by Photocure Systems of Union Carbide Corp. It is equipped with a conveyor system (maximum cure speed achievable was 68 fpm), a nitrogen delivery system that can produce a variety of nitrogen atmospheres or that can be turned off and allow an air atmosphere to be used, and 100 watt-per-inch, unfocused, medium-pressure mercury-vapor lamps to produce the ultraviolet radiation conditions. The unit was also equipped with two low intensity, ultraviolet light-producing germicidal lamps that could be used for preferential surface cure before entering the above described ultraviolet light atmosphere and that could be in either an "ON" or an "OFF" status. Cure Unit I denotes an ultraviolet light cure system with these lamps in an "OFF" status. The unit was further equipped with an ancillary 300 watt per inch, focused ultraviolet light lamp that could be in either an "ON" or an "OFF" status. Cure Unit I denotes an ultraviolet light cure system with this lamp in an "OFF" status.

Cure Unit II was the same as Cure Unit I except the two germicidal lamps were in an "ON" status.

Cure Unit III was an ultraviolet light cure system that involved only the conveyor system and the focused, 300 watt per inch ultraviolet light lamp of Cure Unit I in an "ON" status.

The compositions of the indicated examples were coated with a No. 15 wire-wound rod onto either Bonderite 37 steel designated as B, MYLAR TM polyester film designated as M, Unwaxed, uncoated vinyl tile such as the type used to manufacture home/industrial flooring designated as V, Polycarbonate film designated as C, or other substrate if indicated.

The coated substrates were then exposed to ultraviolet light and cured in the manner described in the following tables. The cured, textured coatings were tested using the methods described above.

| Composition of EXAMPLE | 23 | 24 | 25 | 26 | 27 | 28 |
|---|---|---|---|---|---|---|
| UV Cure System | | | | | | |
| Cure Unit II | Used | Used | — | Used | — | — |
| Cure Unit III | — | — | Used | — | Used | Used |
| Cure Atmosphere | | | | | | |
| Nitrogen (ft³/hr/ lineal ft width of conveyor belt) | Used (300) | Used (300) | — | Used (300) | — | — |
| Air | — | — | Used | — | Used | Used |
| Substrate | C | M | B | B | B | FR-4# |
| Cure Rate | | | | | | |
| Conveyor Speed, feet/min | 10 | 5 | 69 | 10 | 50 | 50 |
| No. of Passes | 1 | 1 | 2 | 1 | 1 | 1 |
| Test Results | | | | | | |
| Double Acetone Rubs | — | — | 100(4) | 100(1) | 100(1) | — |
| Pencil Hardness | — | — | 6B | H | 3B | — |
| Crosshatch Adhesion | Good* | Good* | 5B | 5B | 5B | 5B |
| Surface Appearance** | Text | Text | Text | Text | Fine Text | Fine Text |

*Crosshatch adhesion could not be run in the conventional manner on the film substrates. Adhesion was measured by bending the film back and forth. If the coating adhered, rating was good. If the coating delaminated, rating was poor.
**Text indicates film was textured. Fine Text indicates a fine texture was obtained.
FR-4 is the glass reinforced, flame retarded epoxy printed circuit board material that is known as FR-4 board to those skilled in the art of printed circuit materials.

Example 29-34. The following ingredients were placed in glass bottles, well mixed and stored for later use. In addition to demonstrating systems that will texture when exposed to ultraviolet light, they demonstrate that other acrylates such as epoxy acrylates can be used and that the compositions can be cured with different light sources in different atmospheres (air or nitrogen, and at different cure speeds (conveyor speeds).

| | Example | | | | | |
|---|---|---|---|---|---|---|
| Ingredients, g | 29 | 30 | 31 | 32 | 33 | 34 |
| Polyurea Compound of Example 2 | 40.0 | 40.0 | — | — | — | — |
| Polyurea Compound of Example 1 | — | — | 50.0 | 50.0 | 50.0 | 50.0 |
| Trimethylolpropane triacrylate | 40.0 | 40.0 | 50.0 | 50.0 | 50.0 | 50.0 |
| Epoxy Diacrylate I | 20.0 | 20.0 | — | — | — | — |
| Benzophenone | 3.0 | 3.0 | 3.0 | 3.0 | 3.0 | 3.0 |
| Surfactant I | 0.5 | 0.5 | 1.0 | 1.0 | 1.0 | 1.0 |

These formulations were cured with the following ultraviolet light sources under the conditions indicated and on the indicated substrates. In all cases, textured surfaces were obtained. Cure Units I, II, and III and the substrate designations are described in Examples 23–28. The formulations were coated onto the substrates with a No. 15 wire-wound rod. The coated substrates were then exposed to ultraviolet light and cured in the manner described in the following tables. The cured, textured coatings were tested using the methods described above.

| Composition of EXAMPLE | 29 | 30 | 31 | 32 | 33 | 34 |
|---|---|---|---|---|---|---|
| UV Cure System | | | | | | |
| Cure Unit II | — | — | Used | — | — | — |
| Cure Unit III | Used | Used | — | Used | Used | Used |
| Cure Atmosphere | | | | | | |
| Nitrogen (ft³/hr/ lineal ft width of conveyor belt) | — | — | Used (200) | — | — | — |
| Air | Used | Used | — | Used | Used | Used |
| Substrate | Cu-FR4## | V | B | M | V | Painted Steel |
| Cure Rate | | | | | | |
| Conveyor Speed, feet/min | 50 | 30 | 20 | 50 | 50 | 50 |
| No. of Passes | 1 | 1 | 1 | 2 | 3 | 2 |
| Test Results | | | | | | |
| Double Acetone Rubs | — | — | 100(5) | — | — | — |
| Pencil Hardness | — | — | 4B | — | — | — |
| Crosshatch Adhesion | 1B | Fair* | 5B | Good | Good | — |
| Surface Appearance** | Fine Text | Fine Text | Text | Text | Text | Text |

*Crosshatch adhesion could not be run in the conventional manner on the film and vinyl tile substrates. Adhesion was measured by bending the film back and forth. If the coating adhered, rating was good. If the coating delaminated, rating was poor. An intermediate degree of adhesion was listed as fair.
**Text indicates film was textured. Fine Text indicates a fine texture was obtained.
Cu-FR-4 is copper clad glass-reinforced, flame-retarded epoxy printed-circuit-board material that is known as FR-4 board to those skilled in the art of printed circuit materials.

Example 35. This example further demonstrates that different acrylates can be used in the formulations. Fifty grams of Epoxy Acrylate I, 116.7 grams of an alkoxylated aliphatic diacrylate ester (sold by Sartomer as C9209), 1.67 grams of Surfactant IV, and 6.67 grams of Benzophenone were combined in a glass container and well mixed to ensure a uniform blend. To 20 grams of this blend, 13.36 grams of the Polyurea Compound of Example 2 were added, and these were well blended, coated onto Bonderite 37 steel with a No. 20 wire-wound rod. The coating was cured with one pass at 10 feet per minute under a 300 watt per inch medium pressure mercury vapor light source. A textured coating resulted.

We claim:

1. A process for preparing an ultraviolet light-cured coating having a textured appearance in the as-cured material, which process comprises exposing a photocurable composition in contact with an atmosphere to ultraviolet light for a sufficient length of time to cure the composition and wherein the photocurable composition comprises:

i) an aromatic ketone photosensitizer;
ii) a multifunctional urea compound of the formula $$R \diagdown \begin{matrix} [Q^1]_{z-(zw)} \\ \left[\begin{matrix}(Q^2)_p \\ (Q^3)_s \\ (Q^4)_t\end{matrix}\right]_{zw} \end{matrix}$$

where R is an initiator radical based on a compound containing Zerewitinoff active hydrogen atoms other than thiol active hydrogen atoms and contains from two to six carbon atoms, $Q^1$ is a group of the formula:

$$-(-CH_2CH_2-O)_a(CH_2\underset{\underset{CH_3}{|}}{C}H-O)_b(CH_2\underset{\underset{R'}{|}}{C}H-O)_c-(CH_2)_n\underset{\underset{R''}{|}}{C}H-O(H)_{1-y}(Q^5)_y$$

$Q^2$ is a group of the formula $$-(CH_2CH_2-O)_a(CH_2\underset{\underset{CH_3}{|}}{C}H-O)_b(CH_2\underset{\underset{R'}{|}}{C}H-O)_c-$$

$$-(CH_2)_n\underset{\underset{R''}{|}}{C}H-N(H)_{2-2u}(Q^5)_{2u}$$

$Q^3$ is a group of the formula:

$$-(CH_2CH_2-O)_a(CH_2\underset{\underset{CH_3}{|}}{C}H-O)_b(CH_2\underset{\underset{R'}{|}}{C}H-O)_c-$$

$$-(CH_2)_n\underset{\underset{R''}{|}}{C}H-\underset{\underset{R'''}{|}}{N}(H)_{1-u}(Q^5)_u$$

$Q^4$ is a tertiary amine-containing group of the formula:

$$(CH_2CH_2-O)_a(CH_2\underset{\underset{CH_3}{|}}{C}H-O)_b(CH_2\underset{\underset{R'}{|}}{C}H-O)_c-(CH_2)_n\underset{\underset{R''}{|}}{C}H-\underset{\underset{R''''}{|}}{N}R''';$$

wherein a has a value of from zero to 175, b has a value of 3 to 98, c has a value of zero to 30, n is an integer of from 1 to 3, y has a value of zero to u, u has a value of 0.3 to 1.0, R' is an alkyl group of 2 to 18 carbons, R'' is hydrogen or an alkyl group of one to 18 carbon atoms, R''' and R'''' are independently an alkyl group of 2 to 12 carbon atoms, $Q^5$ is a group represented by the formula:

$$-\underset{\underset{O}{\|}}{C}-\underset{\underset{H}{|}}{N}-R^5$$

wherein $R^5$ is an isopropenyl-substituted α,α-dimethylbenzyl group, p is a mole fraction and ranges from zero to 1.0, s is a mole fraction and ranges from zero to 1.0, t is a mole fraction and ranges from zero to 0.7, the quantity (p+s+t) equals one, w is a mole fraction and ranges from 0.3 to 1.0, z is an integer from 2 to six and (zw) is the product of z and w, and iii) an ethylenically unsaturated compound that will undergo photopolymerization selected from the group consisting of monoacrylates, diacrylates, triacrylates and higher functionality acrylates.

2. The process of claim 1 wherein a is from zero to 90, b is from 3–98, c is from zero 15, R' is an ethyl group, R'' is hydrogen or a methyl or ethyl group, and R''' and R'''' contain from two to six carbon atoms.

3. The process of claim 2 wherein a is from zero to 50, c is from zero to 2, n is one.

4. The process of claim 1 wherein t is from zero to 0.2.

5. The process of claim 1 wherein a and c equal zero, b is 30 to 40, z equals 3, n equals one, and R'' is methyl.

6. The process of claim 5 wherein p equals 0.65 to 1.0, s equals zero to 0.30, t equals zero to 0.05.

7. The process of claim 5 wherein p plus t equals zero to 0.30, s equals 0.70 to 1.0.

8. The process of claim 5 wherein R''' is isopropyl.

9. The process of claim 1 wherein R is $$+O-(CH_2)_4)_d-O-(CH_2)_4-O-$$

wherein d is from 0 to 50, a and c equal zero, z equals 2, n equals 3, and R' is hydrogen.

10. The process of claim 9 wherein d is from 4 to 35.

11. The process of claim 1 wherein the aromatic ketone photosensitizer is benzophenone.

12. The process of claim 11 wherein the process also includes 1-hydroxycyclohexylphenyl ketone as a photoinitiator.

13. The process of claim 1 wherein the aromatic ketone photosensitizer is a mixture of benzophenone and isopropylthioxanthone.

14. The process of claim 1 which also contains one or more photoinitiators of the homolytic fragmentation type.

15. The process of claim 14 wherein the photoinitiator is 2,2-diethoxyacetophenone.

16. The process of claim 14 wherein the photoinitiator is 2,2-diethyoxyacetophenone.

17. The process of claim 1 wherein the ethylenically unsaturated compound is trimethylolpropane triacrylate.

18. The process of claim 1 wherein the ethylenically unsaturated compound is a urethane acrylate.

19. The process of claim 1 wherein the ethylenically unsaturated compound is an epoxy acrylate.

20. The process of claim 1 wherein the ethylenically unsaturated compound is a mixture of trimethylolpropane triacrylate and an epoxy acrylate.

21. The process of claim 1 wherein the ethylenically unsaturated compound is a mixture of trimethylolpropane triacrylate and a urethane acrylate.

22. The cured product of the process of claim 1.

* * * * *